United States Patent
Liou et al.

(12)

(10) Patent No.: US 8,754,506 B1
(45) Date of Patent: Jun. 17, 2014

(54) THROUGH VIA SEMICONDUCTOR DIE WITH BACKSIDE REDISTRIBUTION LAYER

(75) Inventors: Shiann-Ming Liou, Campbell, CA (US); Albert Wu, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 553 days.

(21) Appl. No.: 12/422,160

(22) Filed: Apr. 10, 2009

Related U.S. Application Data

(60) Provisional application No. 61/050,356, filed on May 5, 2008.

(51) Int. Cl.
*H01L 29/40* (2006.01)

(52) U.S. Cl.
USPC ........... 257/621; 257/678; 257/686; 257/783; 257/777; 257/723

(58) Field of Classification Search
USPC .................. 257/621, 678, 686, 783, 777, 723
See application file for complete search history.

(56) References Cited

U.S. PATENT DOCUMENTS

| | | | |
|---|---|---|---|
| 7,205,656 B2* | 4/2007 | Kim et al. | 257/723 |
| 7,645,635 B2* | 1/2010 | Wood et al. | 438/113 |
| 2005/0186705 A1* | 8/2005 | Jackson et al. | 438/106 |
| 2008/0029851 A1* | 2/2008 | Kirby et al. | 257/621 |
| 2009/0102002 A1* | 4/2009 | Chia et al. | 257/433 |
| 2009/0291528 A1* | 11/2009 | Do et al. | 438/109 |

* cited by examiner

Primary Examiner — Long Pham

(57) ABSTRACT

Embodiments of the present invention provide an apparatus that includes a semiconductor substrate comprising a first surface having one or more integrated circuit devices formed thereon and a second surface opposite the first surface, wherein one or more vias are formed through the semiconductor substrate to couple the first surface with the second surface. The apparatus may further include a redistribution layer coupled with the second surface of the semiconductor substrate, wherein the one or more vias couple the redistribution layer with the first surface of the semiconductor substrate. Other embodiments including, for example, associated packages and methods may be described and/or claimed.

7 Claims, 7 Drawing Sheets

THROUGH VIA SEMICONDUCTOR DIE WITH BACKSIDE REDISTRIBUTION LAYER

CROSS REFERENCE TO RELATED APPLICATIONS

The present application claims priority to U.S. Patent Application No. 61/050,356, filed May 5, 2008, the entire specification of which is hereby incorporated by reference in its entirety for all purposes, except for those sections, if any, that are inconsistent with this specification.

TECHNICAL FIELD

Embodiments of the present invention relate to the field of integrated circuits (IC), and more particularly, to IC packages, and associated fabrication methods.

BACKGROUND

Generally, a die may include one or more IC devices formed on a surface of the die and a redistribution layer may typically be formed on the same surface of the die. Such a die may typically be mounted onto a package substrate to form a "package." Some packages may include one or more dies coupled to a package substrate. As IC devices scale to smaller sizes, structures and/or techniques that allow further size scaling of the die or package substrate or that route electrical pathways to accommodate input/output (I/O) signal, power, or ground voltage requirements of the IC devices are desirable.

SUMMARY

The present invention provides an apparatus that includes a semiconductor substrate comprising a first surface having one or more integrated circuit devices formed thereon and a second surface opposite the first surface, wherein one or more vias are formed through the semiconductor substrate to couple the first surface with the second surface, and a redistribution layer coupled with the second surface of the semiconductor substrate, wherein the one or more vias couple the redistribution layer with he first surface of the semiconductor substrate.

In accordance with various embodiments, the redistribution layer is disposed to provide at least one of an input/output (I/O) signal, power, and ground voltage to the first surface of the semiconductor substrate through the one or more vias.

In accordance with various embodiments, the apparatus further includes an electronic device coupled with the redistribution layer, wherein at least one of an input/output (I/O) signal, power, and ground voltage is delivered from the electronic device to the one or more integrated circuit devices on the first surface of the semiconductor substrate through the one or more vias.

In accordance with various embodiments, the second surface of the semiconductor substrate is coupled to at least one of a package substrate and a printed circuit board by a die attach material and, wherein the first surface of the semiconductor substrate is coupled with at least one of the package substrate and the printed circuit board by a wire bond connection.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Embodiments of the present invention may describe structures and techniques associated with a through via semiconductor die having a backside redistribution layer (RDL). In the following detailed description, reference is made to the accompanying drawings which form a part hereof, wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figure 1:
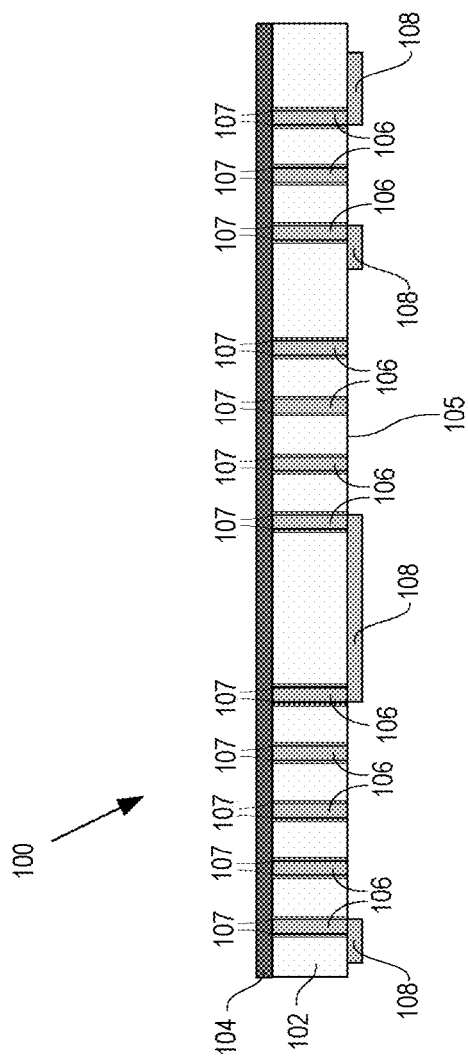
FIG. 1 is an elevation view cross-section schematic of a semiconductor die comprising a redistribution layer, in accordance with various embodiments of the present invention.

FIG. 1 is an elevation view cross-section schematic of a semiconductor die 100 comprising a redistribution layer, in accordance with various embodiments of the present invention. In an embodiment, semiconductor die 100 comprises a semiconductor substrate 102 having a first surface 104 and a second surface 105, one or more vias 106, barrier film 107, and redistribution layer 108, configured as shown.

The first surface 104 may have one or more integrated circuit devices formed thereon. The first surface 104 may be referred to as an "active" or "front" side. One or more integrated circuit devices may comprise, for example, memory, or logic, or combinations thereof. Such memory or logic may comprise one or more transistors. The one or more integrated circuit devices formed on the first surface 104 may send or receive input/output (I/O) signals, power, or ground voltage. The one or more integrated circuit devices may be formed on first surface 104, for example, prior to assembling packaging arrangements described with respect to FIGS. 2-6.

The second surface 105 may be located opposite the first surface as indicated. The second surface 105 may be referred to as a "back" side in one or more embodiments. The term "opposite" may be used to refer to an orientation where the first surface is a "front" side of a semiconductor die and the second surface is a "back" side of a semiconductor die as depicted based on this disclosure and teaching provided herein. Backside surface may be cleaned or polished according to well-known processes such as etch cleans or chemical mechanical planarization (CMP) to provide a substantially smooth or planar surface for redistribution layer 108.

In an embodiment, semiconductor substrate 102 comprises a die. A die may be referred to as a "chip" and may be rectangular in various embodiments, but the shape and nomenclature of semiconductor substrate 102 is not limited in this regard. Semiconductor substrate 102 may comprise silicon (Si), or germanium (Ge), or combinations thereof. However, subject matter is not limited in this regard and semiconductor substrate 102 may comprise other semiconductor materials in other embodiments.

One or more vias 106 may be formed through the semiconductor substrate 102 to form a passage between the first surface 104 and the second surface 105. In an embodiment, the one or more vias 106 are through-hole vias. One or more vias 106 may provide an electrical connection between the first surface 104 and the second surface 105. The one or more vias 106 may also provide an electrical connection between the redistribution layer 108 and the one or more integrated circuit devices formed on the first surface 104.

The one or more vias 106 may comprise a variety of electrically conductive materials. In an embodiment, the one or more vias 106 comprise aluminum (Al), copper (Cu), nickel (Ni), tungsten (W), or gold (Au) or combinations thereof. Subject matter is not limited in this regard and one or more vias 106 may comprise other electrically conductive materials in other embodiments.

One or more vias 106 may be formed in a variety of ways. In an embodiment, one or more vias 106 are formed by drilling, punching, or etching the one or more vias through the semiconductor substrate 102. A barrier film 107 may be deposited on the semiconductor substrate 102 within the one or more vias 106. The barrier film 107 may comprise a barrier material to prevent contamination or diffusion between the semiconductor substrate 102 and the electrically conductive material of the one or more vias 106. The barrier film 107 may comprise a variety of materials, including metals, or metal nitrides, for example, such as titanium nitride (TiN), or tantalum nitride (TaN), or combinations thereof. Subject matter is not limited in this regard and may include other materials in other embodiments. The electrically conductive material described above may be deposited to fill or plug the one or more vias 106 such that an electrical connection is formed between the first surface 104 and the second surface 105 of semiconductor substrate 102.

The redistribution layer (RDL) 108 may be formed on the second surface 105 such that the one or more vias 106 electrically couple the redistribution layer 108 with the first surface 104. Such redistribution layer 108 may be referred to as a "backside" redistribution layer 108. Redistribution layer 108 may comprise one or more traces coupled with the one or more vias 106 to route electrical connections between the one or more integrated circuit devices on the first surface 104 with one or more other devices that may be coupled to the redistribution layer 108. The one or more other devices that may be coupled to the redistribution layer 108 may be described further with respect to FIGS. 2-7.

Redistribution layer 108 may be formed in a variety of ways. In an embodiment, redistribution layer 108 is formed by depositing one or more electrically conductive materials to the second surface 105 and patterning the electrically conductive material(s) to form one or more traces coupled with the one or more vias 106 to provide one or more input/output (I/O) signals, power, or ground voltage, or combinations thereof, to the one or more integrated circuit devices formed on the first surface 104. The one or more I/O signals, power, or ground voltage may be delivered through the one or more vias 106. Deposition of material described herein may be accomplished by chemical vapor deposition (CVD), physical vapor deposition (PVD), atomic layer deposition (ALD), or any other suitable deposition process. Based on the disclosure and teaching provided herein, well known fabrication processes including lithography, etch, planarization, or cleaning operations may be used to form redistribution layer 108.

The redistribution layer 108 may comprise a variety of electrically conductive materials. In an embodiment, redistribution layer 108 comprises aluminum (Al), copper (Cu), nickel (Ni), tungsten (W), or gold (Au) or combinations thereof. Subject matter is not limited in this regard and redistribution layer 108 may comprise other electrically conductive materials in other embodiments.

The redistribution layer 108 may allow reduced I/O signal connections or counts for semiconductor die 100, reduced size of semiconductor die 100, or improved delivery of power or ground voltage to one or more integrated circuit devices formed on the first surface 104 of semiconductor substrate 102, or combinations thereof. Semiconductor die 100 having the redistribution layer 108 may be integrated in a variety of packaging schemes as described with respect to FIGS. 2-7 to provide such benefits.

Figure 2:
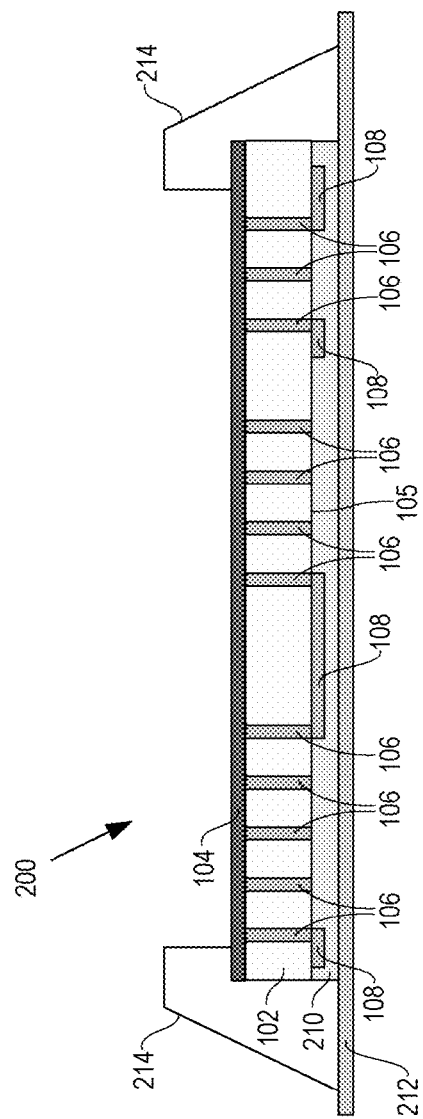
FIGS. 2-6 include elevation view cross-section schematics of packaging arrangements for a semiconductor die comprising a redistribution layer, in accordance with various embodiments of the present invention.

FIG. 2 is an elevation view cross-section schematic of a packaging arrangement 200 for a semiconductor die comprising a redistribution layer, in accordance with various embodiments of the present invention. In an embodiment, the packaging arrangement 200 includes a semiconductor substrate 102 having a first surface 104 and a second surface 105, one or more vias 106, redistribution layer 108, die attach material 210, package substrate 212, and wire bond 214, configured as shown. Embodiments already described with respect to FIG. 1 may be implemented with respect to FIGS. 2-7.

An electronic device may be coupled with the redistribution layer 108, wherein one or more I/O signals, power, or ground voltage, or combinations thereof, can be delivered from the electronic device to the one or more integrated circuit devices on the first surface 104 of the semiconductor substrate 102 through the one or more vias 106. The electronic device may include a variety of devices including, for example, a package substrate, cavity, pad, printed circuit board, motherboard, or semiconductor die comprising logic or memory, or combinations thereof.

In an embodiment according to FIG. 2, the second surface 105 of semiconductor substrate 102 is coupled to a package substrate or a printed circuit board (PCB) 212, or combinations thereof, by a die attach material 210. Redistribution layer 108 may be coupled with the die attach material 210. Die attach material 210 may comprise a variety of materials including, for example, polymers, metals, or alloys, or combinations thereof. Die attach material 210 may attach the semiconductor substrate 102 to the substrate/board 212. Die attach material 210 may further provide thermal and/or electrical conductivity between the semiconductor substrate 102 and the substrate/board 212. Such die attach material 210 may be selected based on performance and/or power requirements of the one or more integrated circuit devices formed on the first surface 104 of semiconductor substrate 102.

In an embodiment, the first surface 104 of the semiconductor substrate 102 is coupled with the package substrate or the printed circuit board 212, or combinations thereof, by a wire bond 214 connection. Wire bond 214 may provide an interconnect between one or more integrated circuit devices on the first surface 104 and the package substrate/printed circuit board 212. Wire bond 214 may include a variety of electrically conductive materials. In an embodiment, wire bond 214 includes gold (Au), aluminum (Al), or copper (Cu), or combinations thereof. Subject matter is not limited in this regard and wire bond 214 may include other well known or suitable materials in other embodiments.

Figure 3:
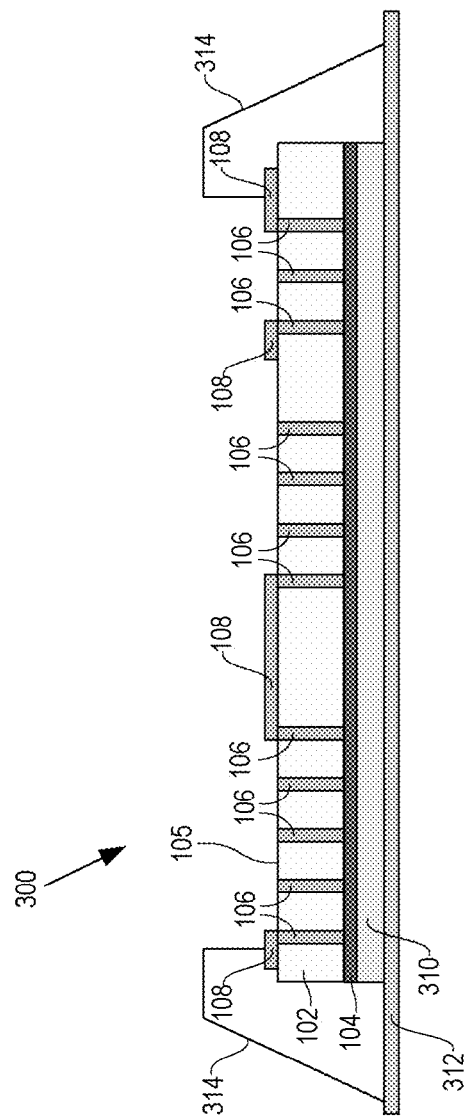

FIG. 3 is an elevation view cross-section schematic of another packaging arrangement 300 for a semiconductor die comprising a redistribution layer, in accordance with various embodiments of the present invention. In an embodiment, packaging arrangement 300 includes a semiconductor substrate 102 having a first surface 104 and a second surface 105, one or more vias 106, redistribution layer 108, die attach material 310, package substrate 312, and wire bond 314, configured as shown.

In an embodiment, the first surface 104 of semiconductor substrate 102 is coupled to a package substrate or a printed circuit board (PCB) 312, or combinations thereof, by a die attach material 310. Die attach material 310 may comprise a variety of materials including, for example, polymers, metals, or alloys, or combinations thereof. Die attach material 310 may attach the semiconductor substrate 102 to the substrate/board 312. Die attach material 310 may further provide thermal and/or electrical conductivity between the semiconductor substrate 102 and the substrate/board 312. Such die attach material 310 may be selected based on performance and/or power requirements of the one or more integrated circuit devices formed on the first surface 104 of semiconductor substrate 102.

In an embodiment, the second surface 105 of the semiconductor substrate 102 is coupled with the package substrate or the printed circuit board 312, or combinations thereof, by a wire bond 314 connection. Wire bond 314 may couple the redistribution layer 108 with the package substrate/PCB 312. Wire bond 314 may provide an interconnect between one or more integrated circuit devices on the first surface 104 and the package substrate/printed circuit board 312. Wire bond 314 may include a variety of electrically conductive materials. In an embodiment, wire bond 314 includes gold (Au), aluminum (Al), or copper (Cu), or combinations thereof. Subject matter is not limited in this regard and wire bond 314 may include other well known or suitable materials in other embodiments.

Figure 4:
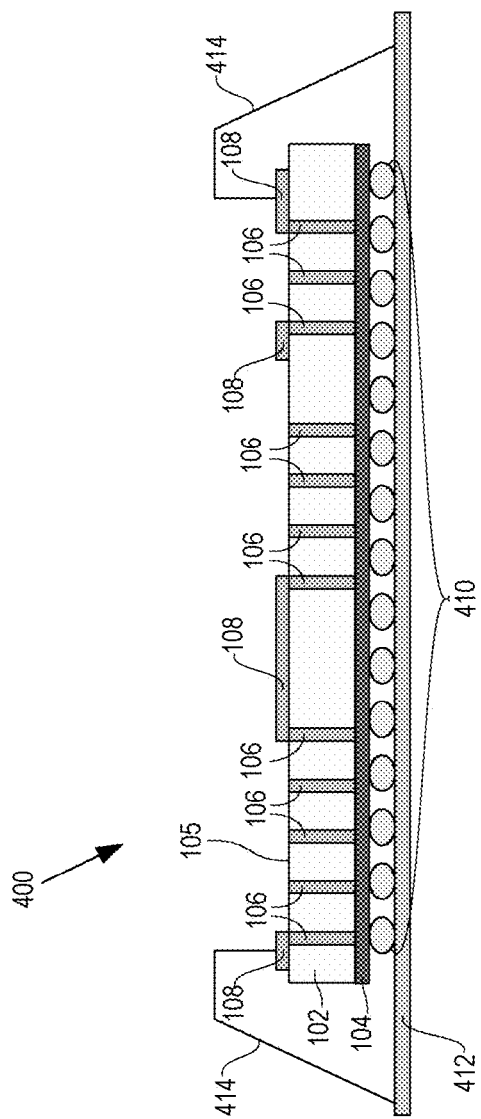

FIG. 4 is an elevation view cross-section schematic of another packaging arrangement 400 for a semiconductor die comprising a redistribution layer, in accordance with various embodiments of the present invention. In an embodiment, packaging arrangement 400 includes a semiconductor substrate 102 having a first surface 104 and a second surface 105, one or more vias 106, redistribution layer 108, one or more bumps or posts 410, package substrate 412, and wire bond 414, configured as shown.

In an embodiment, the first surface 104 of semiconductor substrate 102 is coupled to a package substrate or a printed circuit board (PCB) 412, or combinations thereof, by bumps or posts 410. Bumps or posts 410 may comprise a variety of solderable materials including, for example, metals, or alloys, or combinations thereof. The bumps or posts 410 may attach the semiconductor substrate 102 to the substrate/board 412. Bumps or posts 410 may further provide thermal and/or electrical conductivity between the semiconductor substrate 102 and the substrate/board 412 and may function as interconnects to deliver I/O signals, power, or ground voltage. Materials for bumps or posts 410 may be selected based on performance and/or power requirements of the one or more integrated circuit devices formed on the first surface 104 of semiconductor substrate 102.

Packaging arrangement 400 may depict a flip-chip arrangement. Such arrangement 400 may allow for reduced size of semiconductor substrate 102 where, for example, a number of pads coupled with the one or more integrated circuit devices on the first surface 104 limit the size of semiconductor substrate. Redistribution layer 108 may allow improved delivery of power and/or ground to the one or more integrated circuit devices formed on the first surface 104 of semiconductor substrate 102. An area between the bumps or posts 410 may be filled with an underfill material, which may include an electrically insulative adhesive to provide additional mechanical support and/or electrical insulation.

In an embodiment, the second surface 105 of the semiconductor substrate 102 is coupled with the package substrate or the printed circuit board 412, or combinations thereof, by a wire bond 414 connection. Wire bond 414 may couple the redistribution layer 108 with the package substrate/PCB 412. Wire bond 414 may provide an interconnect between one or more integrated circuit devices on the first surface 104 and the package substrate/printed circuit board 412 through the one or more vias 106 and the redistribution layer 108.

Wire bond 414 may include a variety of electrically conductive materials. In an embodiment, wire bond 414 includes gold (Au), aluminum (Al), or copper (Cu), or combinations thereof. Subject matter is not limited in this regard and wire bond 414 may include other well known or suitable materials in other embodiments.

Figure 5:
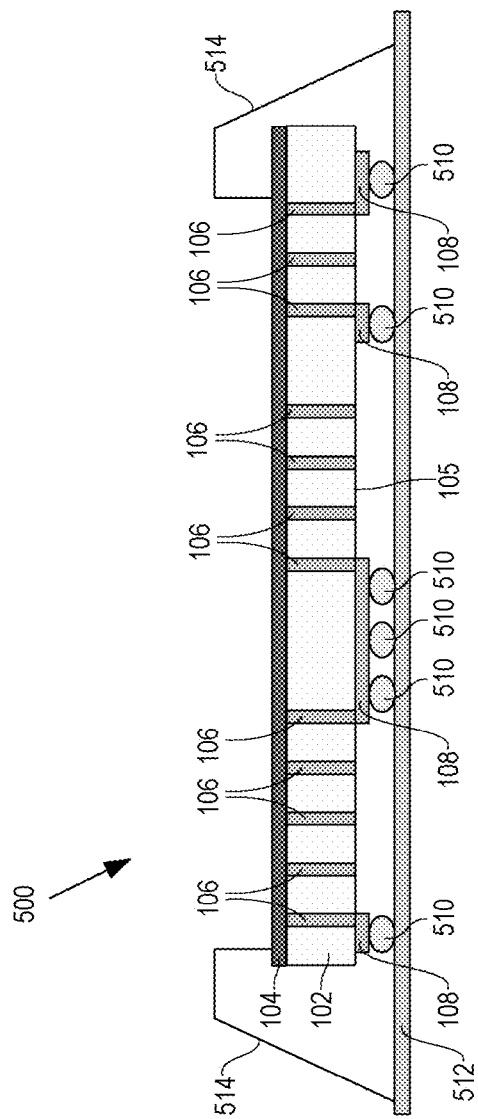

FIG. 5 is an elevation view cross-section schematic of another packaging arrangement 500 for a semiconductor die comprising a redistribution layer, in accordance with various embodiments of the present invention. In an embodiment, packaging arrangement 500 includes a semiconductor substrate 102 having a first surface 104 and a second surface 105, one or more vias 106, redistribution layer 108, one or more bumps or posts 510, package substrate 512, and wire bond 514, configured as shown.

In an embodiment, the second surface 105 of semiconductor substrate 102 is coupled to a package substrate or a printed circuit board (PCB) 512, or combinations thereof, by bumps or posts 510. Bumps or posts 510 may serve as interconnects between the redistribution layer 108 and the package substrate/PCB 512. Bumps or posts 510 may comprise a variety of solderable materials including, for example, metals, or alloys, or combinations thereof. The bumps or posts 510 may attach the semiconductor substrate 102 to the substrate/board 512. Bumps or posts 510 may further provide thermal and/or electrical conductivity between the semiconductor substrate 102 and the substrate/board 512. Materials for bumps or posts 510 may be selected based on performance and/or power requirements of the one or more integrated circuit devices formed on the first surface 104 of semiconductor substrate 102.

Packaging arrangement 500 may depict a flip-chip arrangement. Such arrangement 500 may allow for reduced size of semiconductor substrate 102 where, for example, a number of pads coupled with the one or more integrated circuit devices on the first surface 104 limit the size of semiconductor substrate 102. Redistribution layer 108 may allow improved delivery of power and/or ground to the one or more integrated circuit devices formed on the first surface 104 of semiconductor substrate 102. An area between the bumps or posts 510 may be filled with an underfill material, which may include an electrically insulative adhesive to provide additional mechanical support and/or electrical insulation.

In an embodiment, the first surface 104 of the semiconductor substrate 102 is coupled with the package substrate or the printed circuit board 512, or combinations thereof, by a wire bond 514 connection. Wire bond 514 may provide an interconnect between one or more integrated circuit devices on the first surface 104 and the package substrate/printed circuit board 512.

Wire bond 514 may include a variety of electrically conductive materials. In an embodiment, wire bond 514 includes gold (Au), aluminum (Al), or copper (Cu), or combinations thereof. Subject matter is not limited in this regard and wire bond 514 may include other well known or suitable materials in other embodiments.

Figure 6:
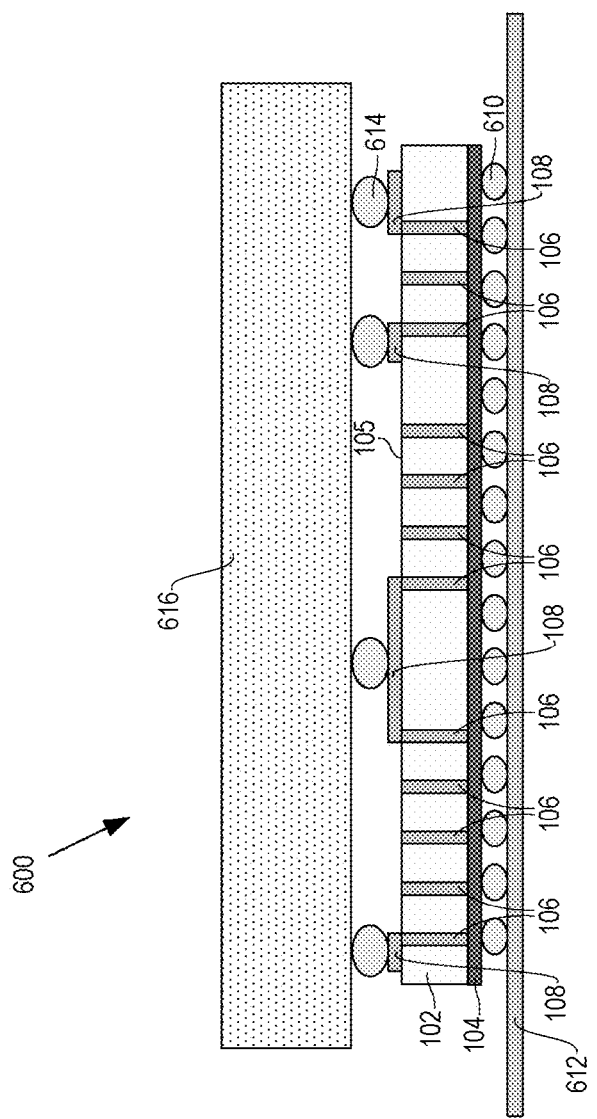

FIG. 6 is an elevation view cross-section schematic of another packaging arrangement 600 for a semiconductor die comprising a redistribution layer, in accordance with various embodiments of the present invention. In an embodiment, packaging arrangement 600 includes a semiconductor substrate 102 having a first surface 104 and a second surface 105, one or more vias 106, redistribution layer 108, one or more first bumps or posts 610, package substrate 612, one or more second bumps or posts 614, and package part 616, configured as shown.

In an embodiment, the first surface 104 of semiconductor substrate 102 is coupled to a package substrate or a printed circuit board (PCB) 612, or combinations thereof, by first bumps or posts 610. First bumps or posts 610 may comprise a variety of solderable materials including, for example, metals, or alloys, or combinations thereof. First bumps or posts 610 may attach the semiconductor substrate 102 to the substrate/board 612. First bumps or posts 610 may further provide thermal and/or electrical conductivity between the semiconductor substrate 102 and the substrate/board 612 and may function as interconnects to deliver I/O signals, power, or ground voltage. Materials for first bumps or posts 610 may be selected based on performance and/or power requirements of the one or more integrated circuit devices formed on the first surface 104 of semiconductor substrate 102.

Packaging arrangement 600 may depict a flip-chip arrangement. Such arrangement 600 may allow for reduced size of semiconductor substrate 102 where, for example, a number of pads coupled with the one or more integrated circuit devices on the first surface 104 limit the size of semiconductor substrate 102. Redistribution layer 108 may allow improved delivery of power and/or ground to the one or more integrated circuit devices formed on the first surface 104 of semiconductor substrate 102. An area between the first bumps or posts 610 may be filled with an underfill material, which may include an electrically insulative adhesive to provide additional mechanical support and/or electrical insulation.

In an embodiment, the second surface 105 of the semiconductor substrate 102 is coupled with a package part 616. The redistribution layer 108 on the second surface 105 may be coupled with the package part 616 in a variety of ways. In an embodiment, the redistribution layer 108 is coupled with the package part 616 by second bumps or posts 614. Second bumps or posts 614 may provide an interconnect between one or more integrated circuit devices on the first surface 104 and the package part 616 through the one or more vias 106 and the redistribution layer 108.

Second bumps or posts 614 may comprise a variety of solderable materials. In an embodiment, second bumps or posts 614 include, for example, metals, or alloys, or combinations thereof. Second bumps or posts 614 may attach the package part 616 to the semiconductor substrate 102. Second bumps or posts 614 may further provide thermal and/or electrical conductivity between the semiconductor substrate 102 and the package part 616 and may function as interconnects to deliver I/O signals, power, or ground voltage.

Package part 616 may represent a variety of electronic devices and/or a variety of well known packages. In an embodiment, package part 616 comprises a ball grid array (BGA), quad flat package (QFP), quad flat non-leaded (QFN), thin small outline package (TSOP), or thin shrink small outline package (TSSOP), or combinations thereof. In an embodiment, package part 616 comprises logic, memory, or combinations thereof. For example, the semiconductor substrate 102 may comprise an application specific integrated circuit (ASIC) formed on the first surface 104 and the package part 616 may comprise a memory device. Other electronic devices may be integrated in arrangement 600 according to various other embodiments.

Figure 7:
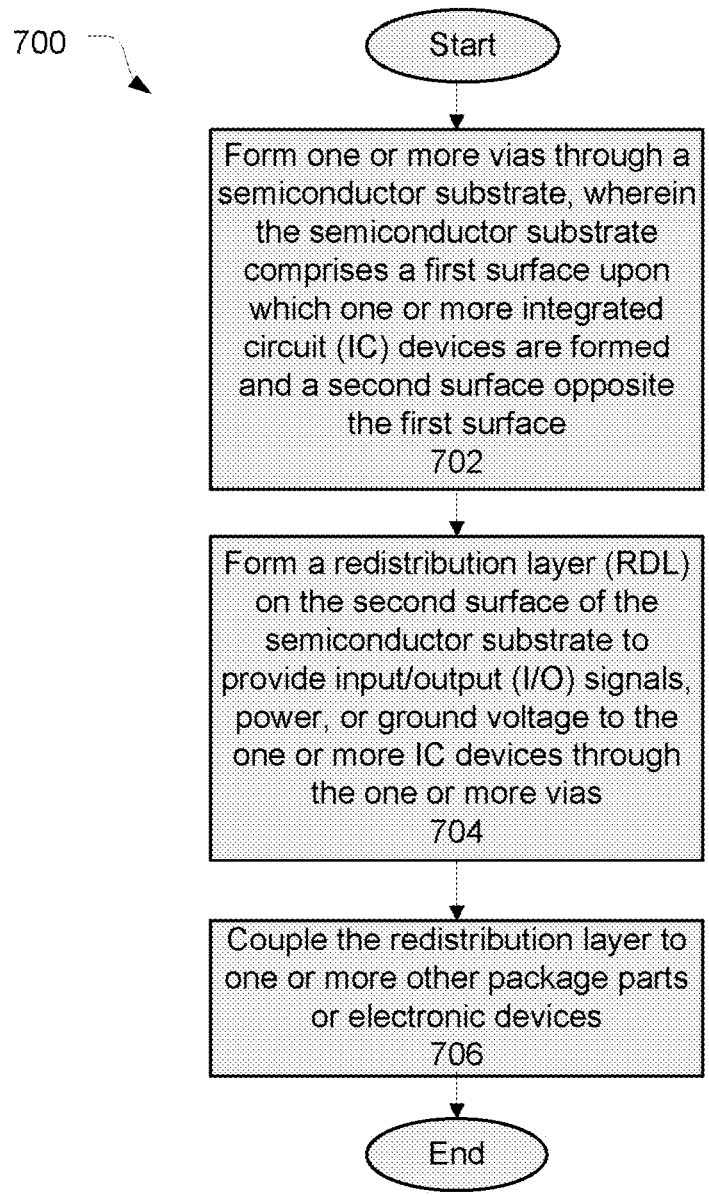
FIG. 7 is a process flow diagram of a method for fabricating a package that includes a semiconductor die comprising a redistribution layer, in accordance with various embodiments of the present invention.

FIG. 7 is a process flow diagram of a method for fabricating a package that includes a semiconductor die comprising a redistribution layer, in accordance with various embodiments of the present invention. In an embodiment, a method 700 includes forming one or more vias through a semiconductor substrate wherein the semiconductor substrate comprises a first surface upon which one or more integrated circuit (IC) devices are formed and a second surface opposite the first surface at 702. Method 700 may further include forming a redistribution layer (RDL) on the second surface of the semiconductor substrate to provide input/output (I/O) signals, power, or ground voltage to the one or more IC devices through the one or more vias at 704 and coupling the redistribution layer to one or more other package parts or electronic devices at 706.

The term "opposite" may be used to refer to an orientation where the first surface is a "front" side of a semiconductor die and the second surface is a "back" side of a semiconductor die. One or more integrated circuit devices may be formed by a variety of semiconductor fabrication processes including, for example, thin film deposition, lithography, etch, polish, implant, diffusion, or metrology, and may include, for example, forming one or more transistors on a semiconductor die comprising silicon. Other materials and structures may be used to form one or more integrated circuit devices in other embodiments.

In an embodiment, forming the one or more vias at 702 is accomplished by drilling, punching, or etching, or combinations thereof, the one or more vias through the semiconductor substrate. Forming the one or more vias at 702 may further comprise forming a barrier film on the semiconductor substrate within the one or more vias. A barrier film may be formed by depositing a barrier material to prevent contamination or diffusion between the semiconductor substrate and an electrically conductive material of the one or more vias. Forming the one or more vias at 702 may further comprise depositing the electrically conductive material to fill the one or more vias. Depositing the electrically conductive material may comprise depositing aluminum (Al), copper (Cu), nickel (Ni), tungsten (W), or gold (Au), or combinations thereof. Other electrically conductive materials may be deposited in other embodiments.

In an embodiment, forming the one or more vias at 702 comprises forming one or more through-hole vias. Forming the one or more vias at 702 through the semiconductor substrate may provide an electrical connection between the one or more integrated circuit devices and the redistribution layer.

Method 700 may further include forming a redistribution layer on the second surface of the semiconductor substrate at 704. The redistribution layer may be coupled with the one or more vias to provide I/O signals, power, or ground voltage, or combinations thereof, to the one or more IC devices through the one or more vias.

Forming the redistribution layer at 704 may comprise forming one or more traces coupled with the one or more vias to route electrical connections between the one or more integrated circuit devices and one or more other devices to be coupled with the redistribution layer. In an embodiment, forming the redistribution layer at 704 includes depositing one or more electrically conductive materials to the second surface of the semiconductor substrate and patterning the one or more electrically conductive materials to form one or more traces coupled with the one or more vias to provide the one or more I/O signals, power, or ground voltage to the one or more integrated circuit devices of the semiconductor substrate. The electrically conductive materials deposited to form redistribution layer at 704 may include, for example, aluminum (Al), copper (Cu), nickel (Ni), tungsten (W), or gold (Au), or combinations thereof. Other materials may be used in other embodiments.

Method 700 may further include coupling an electronic device with the redistribution layer at 706 such that the one or more I/O signals, power, or ground voltage, or combinations thereof, can be delivered from the electronic device to the one or more integrated circuit devices of the semiconductor substrate through the one or more vias. Embodiments including arrangements described with respect to FIGS. 1-6 may be fabricated based on method 700.

In an embodiment, method 700 includes coupling the redistribution layer with a package substrate or a printed circuit board at 706 using a die attach material and coupling the first surface of the semiconductor substrate with the package substrate or the printed circuit board using a wire bond connection. In another embodiment, method 700 includes coupling the first surface of the semiconductor substrate with a package substrate or a printed circuit board using a die attach material, and coupling the redistribution layer with the package substrate or the printed circuit board using a wire bond connection at 706.

In an embodiment, method 700 includes coupling the first surface of the semiconductor substrate with a package substrate or a printed circuit board using solder bumps or posts in a flip chip arrangement and coupling the redistribution layer with the package substrate or the printed circuit board using a wire bond connection at 706. In another embodiment, method 700 includes coupling the redistribution layer with a package substrate or printed circuit board using solder bumps or posts in a flip chip arrangement at 706, and coupling the first surface of the semiconductor substrate with the package substrate or the printed circuit board using a wire bond connection.

Coupling the semiconductor substrate with a package substrate using solder bumps or posts in a flip chip arrangement may be accomplished by well known methods including, for example, depositing solder to interconnect structures coupled with one or more integrated circuit devices of the semiconductor substrate, and bringing the solder into sufficient proximity with the package substrate such that reflowing causes a solder bond to form between the semiconductor substrate and the package substrate. Underfill materials may be deposited between the solder interconnects to provide mechanical stability and/or electrical isolation.

Method 700 may include coupling the first surface of the semiconductor substrate with a package substrate or a printed circuit board using solder bumps or posts in a flip chip arrangement, and coupling the redistribution layer with a package part. The package part may comprise a ball grid array (BGA), quad flat package (QFP), quad flat non-leaded (QFN), thin small outline package (TSOP), thin shrink small outline package (TSSOP), or combinations thereof. In an embodiment, the redistribution layer is coupled with an electronic device at 706 comprising logic, memory, or combinations thereof. For example, the semiconductor substrate may comprise an application specific integrated circuit (ASIC) and the package part may comprise a memory device in one embodiment. Other arrangements may be used in other embodiments.

Various operations may have been described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus, comprising:
    a semiconductor substrate having
        (i) a first surface, wherein an integrated circuit device is formed on the first surface,
        (ii) a second surface disposed opposite to the first surface, wherein the second surface is attached to a package substrate with a die attach material, and
        (iii) one or more vias formed through the semiconductor substrate, wherein the one or more vias couple the first surface and the second surface; and
    a redistribution layer that is (i) formed on the second surface of the semiconductor substrate, and (ii) coupled to the first surface through the one or more vias, wherein no bumps, posts, or solder balls are disposed between the second surface and the package substrate to electrically couple the redistribution layer to the package substrate.

2. The apparatus of claim 1, wherein:
    the semiconductor substrate corresponds to a silicon die.

3. The apparatus of claim 1, wherein the redistribution layer is an electrically conductive material comprising one or more of aluminum (Al), copper (Cu), nickel (Ni), tungsten (W), and gold (Au).

4. The apparatus of claim 1, wherein the one or more vias provide a conductive connection between (i) the redistribution layer at the second surface, and (ii) the integrated circuit device formed on the first surface.

5. The apparatus of claim 1, wherein the redistribution layer is disposed on the second surface to provide at least one of an input/output (I/O) signal, power, and ground voltage, at the first surface of the semiconductor substrate through the one or more vias.

6. The apparatus of claim 1, wherein the first surface is coupled to the package substrate with a wire bond connection.

7. The apparatus of claim 1, wherein the redistribution layer that is formed on the second surface of the semiconductor substrate is indirectly coupled to the first surface of the semiconductor substrate using the vias.

* * * * *